United States Patent [19]

Tihanyi

[11] 4,247,860
[45] Jan. 27, 1981

[54] MIS FIELD EFFECT TRANSISTOR FOR HIGH SOURCE-DRAIN VOLTAGES

[75] Inventor: Jenoe Tihanyi, Munich, Fed. Rep. of Germany

[73] Assignee: Siemens Aktiengesellschaft, Berlin & Munich, Fed. Rep. of Germany

[21] Appl. No.: 873,234

[22] Filed: Jan. 30, 1978

[30] Foreign Application Priority Data

Feb. 16, 1977 [DE] Fed. Rep. of Germany ....... 2706623

[51] Int. Cl.³ .......................................... H01L 29/78
[52] U.S. Cl. ........................................ 357/23; 357/20; 357/55; 357/91
[58] Field of Search .................. 357/23, 91, 20, 55; 307/770

[56] References Cited

U.S. PATENT DOCUMENTS

| | | | |
|---|---|---|---|
| 3,339,128 | 8/1967 | Olmstead et al. | 357/23 |
| 3,436,620 | 4/1969 | Diemer et al. | 357/23 |
| 3,604,990 | 9/1971 | Sigsbee | 357/23 |
| 4,029,522 | 6/1977 | Delamoneda | 357/91 |
| 4,062,037 | 12/1977 | Togei et al. | 357/23 |
| 4,063,267 | 12/1977 | Hsia | 357/23 |
| 4,069,430 | 1/1978 | Masuda | 307/270 |
| 4,112,455 | 9/1978 | Seliger et al. | 357/23 |
| 4,115,794 | 9/1978 | Delamoneda | 357/91 |
| 4,132,998 | 1/1979 | Dingwall | 357/91 |
| 4,143,388 | 3/1979 | Esaki et al. | 357/91 |

OTHER PUBLICATIONS

"MOSFET Power Soars to 60 W With Currents up to 2A," Electronic Design, vol. 21 #3, Oct. 11, 1975, pp. 103-104.

*Primary Examiner*—Joseph E. Clawson, Jr.
*Attorney, Agent, or Firm*—Hill, Van Santen, Steadman, Chiara & Simpson

[57] ABSTRACT

A MIS field effect transistor of the depletion type having source, drain and channel regions of a first conductivity type formed in a substrate of the second conductivity type. A gate electrode is formed on an insulating layer above the channel. The spacing between the channel and the gate electrode increases between the source and the drain. This increase in spacing may be a continuous increase in the direction of the drain or may be a series of steps. A circuit arrangement is described where a plurality of these depletion MIS field effect transistors of the above type are serially connected with the source of the first of these depletion type transistors, connected to the drain of a preceding enhancement type MIS field effect transistor.

19 Claims, 5 Drawing Figures

MIS FIELD EFFECT TRANSISTOR FOR HIGH SOURCE-DRAIN VOLTAGES

FIELD OF THE INVENTION

This invention relates to a MIS field effect transistor (metal-insulation-semiconductor field effect transistor) for high source-drain voltages.

BACKGROUND OF THE INVENTION

In semiconductor technology, in liquid crystal displays or MNOS storage circuits, MIS field effect transistors are frequently used for the driver stages. Conventional MIS field effect transistors generally function only for source-drain voltages of up to approximately 40 V as the breakdown voltage is reached in this range.

The VMOS- and DMOS field effect transistors are known as MIS field effect transistors for high breakdown voltages ("Electronic Design", Vol. 21, 11th Oct. 1975, pages 103 and 104). A disadvantage of a VMOS-transistor consists in that its production requires that a total of four differently doped layers be arranged one above another in a semiconductor substrate and that etching is required in order to achieve the V-like structure of this component.

SUMMARY OF THE INVENTION

It is an object of the present invention to provide a MIS field effect transistor which operates reliably even at high source-drain voltages of about 100 V.

This objective is attained by a MIS field effect transistor which is of a type as hereinafter described, and particularly in a structure in which the distance between the gate electrode and the channel zone increases in a direction toward the drain zone.

The invention is based on the following considerations: namely that if a MIS field effect transistor of the "depletion" type is operated in a source-follower operation, the source side reaches a maximum voltage which is that which prevails when the area between source and drain is cleared as in this case no drain current flows. Only at very much higher source-drain voltages do impact ionization effects occur which lead to an avalanche breakdown. This fact can be exploited in order to increase the dielectric strength of a MIS field effect transistor by connecting a MIS field effect transistor of the enhancement type having a relatively low drain-source breakdown voltage in series with a MIS field effect transistor of the depletion type, and conductively connecting the two gate electrodes of these MIS field effect transistors to one another. These two MIS field effect transistors are matched in such a manner that in the region of the provided gate-control voltages, the field effect transistor of the depletion type is always in the switched-through, conductive state. With high voltages between the source electrode of the enhancement transistor and the drain electrode of the depletion transistor, the channel zone of the depletion transistor is evacuated so that for this reason the source side of the depletion transistor and thus also the drain side of the enhancement transistor only reach a maximum voltage. The dielectric strength of a component of this type can be further increased if a chain circuit comprising a plurality of depletion transistors is used instead of one depletion transistor, in which case the breakdown voltage $U_{DB}$ of such a depletion transistor is higher than the breakdown voltage of the depletion transistor by which it is preceded in the series, and the saturation voltage $U_s$ of such a depletion transistor is lower than the breakdown voltage of the depletion transistor by which it is preceded in the series. With a circuit of this kind, the maximum operating voltage is approximately the breakdown voltage $U_{DBn}$ of the n-th, last depletion transistor. A circuit of this kind can, in accordance with the invention, be simply constructed in integrated form by employing a DIMOS field effect transistor (double insulated metal oxide semiconductor field effect transistor) for the enhancement MIS field effect transistor. A DIMOS field effect transistor of this type possesses a strongly doped source zone of the first conductivity type which is adjoined by a likewise doped channel zone of the same conductivity type. Beneath the channel zone is arranged a doped zone of the second conductivity type which compels the charge carriers emanating from the source zone to overcome an energy barrier in order to reach the drain zone of the first conductivity type arranged at the other end of the channel zone. Therefore, this doped zone of the second conductivity type lying beneath the channel zone ensures that this enhancement transistor is in the normally off state. If a transistor of this type is constructed to be asymmetrical in respect of the local positioning of the further doped zone of the second conductivity type, in that the channel zone extends further at the drain side than at the source side, this corresponds to an integrated circuit consisting of a DIMOS field effect transistor of this type. If the distance between the channel zone and the gate electrode now increases in stepped fashion in the direction towards the drain electrode, the region of each state corresponds to one individual depletion field effect transistor, where the breakdown voltage of an individual depletion field effect transistor of this type increases with an increasing distance of the gate electrode from the channel zone, and the saturation voltage also increases. Thus, this type of construction forms a chain circuit of depletion field effect transistors which fulfills the set condition that one individual depletion transistor is to possess a greater breakdown voltage and a lower saturation voltage than the depletion field effect transistor by which it is preceded in the series.

In place of a stepped gradient of the distance between the gate electrode and the channel zone, the increase in this distance can also be continuous.

In order to achieve an increasing distance between the gate electrode and the channel zone, in accordance with the embodiments of the invention, the thickness of the gate insulator can be increased; however, it is also possible to cause the channel zone to commence at the substrate surface and to run increasingly more deeply beneath the substrate surface in the direction towards the drain zone.

A further preferred embodiment of the invention provides that the gate electrode is somewhat offset relative to the drain zone so that directly in front of the gate electrode, in a length of approximately 0.1 to 5 $\mu$m the channel zone is not covered by the gate electrode. An embodiment of this type ensures that the electric field prevailing between the gate electrode and the drain electrode during the operation of the field effect transistor is of lesser magnitude, as a result of which the breakdown voltage of such a MIS field effect transistor is increased.

A further embodiment of the invention provides that the field effect transistor in accordance with the invention be constructed in an ESFI-technique (epitaxial silicon film insulating substrate-technique) inside an epitaxial silicon film provided on an insulating substrate, e.g., a sapphire wafer.

In the following, the invention will be described and explained in detail, making reference to the figures of the drawings.

DESCRIPTION OF THE PREFERRED EMBODIMENTS

Figure 1:
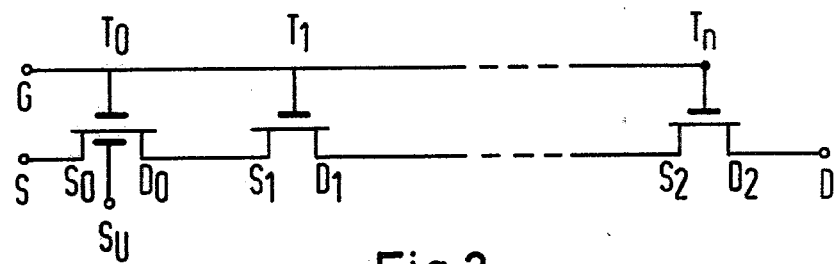
FIG. 1 is an equivalent circuit diagram of a MIS field effect transistor in accordance with the invention.

FIG. 1 shows an equivalent circuit diagram of a MIS field effect transistor in accordance with the invention, on the basis of which the mode of operation of the field effect transistor in accordance with the invention can be explained. The equivalent circuit diagram illustrates a series arrangement of transistors $T_0, T_1 \ldots T_n$, wherein the drain electrode of a transistor is in each case connected to the source electrode of the following transistor, and wherein all the gate electrodes of the individual transistors are interconnected. The first transistor of the series $T_0$ is a MIS field effect transistor of the enhancement type which is a normally off transistor. This first transistor $T_0$ has the lowest breakdown voltage of the transistors in the series arrangement. The following transistors $T_1$ to $T_n$ are all field effect transistors of the depletion type. Of these transistors, the transistor $T_1$ has the lowest breakdown voltage, and the transistor $T_n$ the highest breakdown voltage. An integrated construction for a series arrangement of this type of field effect transistors, as shown by the equivalent circuit diagram, is provided by the exemplary embodiments, illustrated in FIGS. 3, 4 and 5 of the MIS field effect transistor in accordance with the invention.

Figure 2:
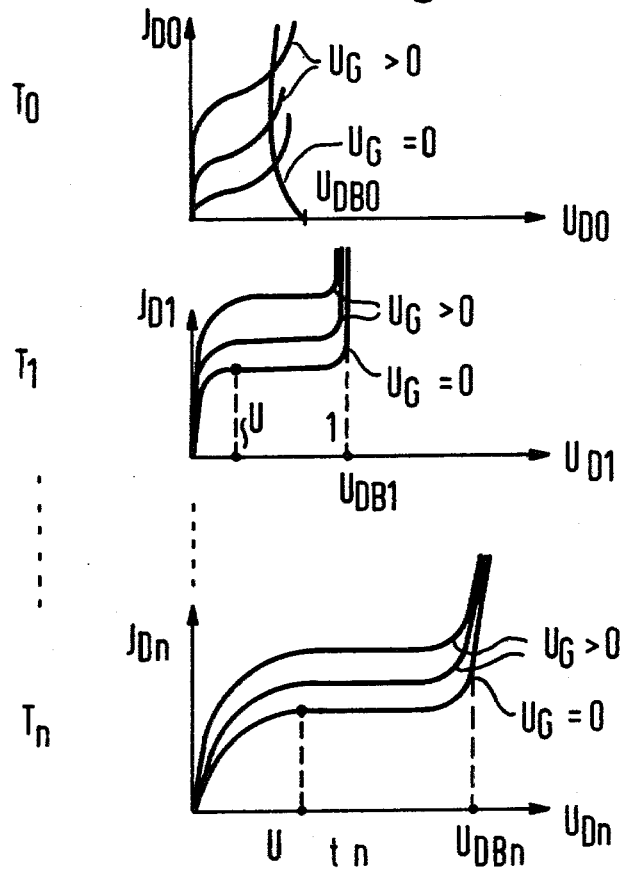
FIG. 2 shows the characteristic curve of the individual transistors of the equivalent circuit diagram.

The matching of the individual transistors $T_0 \ldots T_n$ can be seen from the families of curves in FIG. 2.

Figure 3:
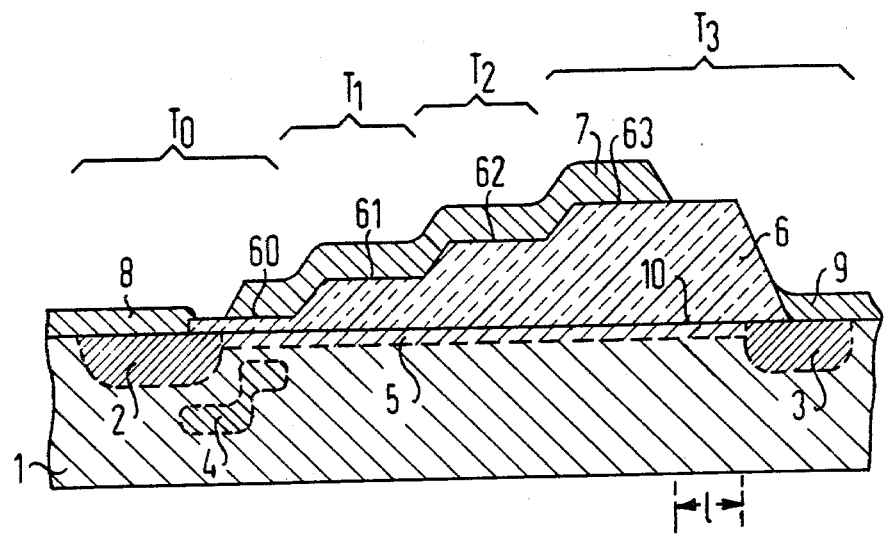
FIGS. 3, 4 and 5 illustrate exemplary embodiments of a MIS field effect transistor in accordance with the invention.

FIG. 3 illustrates an example of a MIS field effect transistor in accordance with the invention. This consists of a semiconductor substrate 1, for example, a silicon substrate. This silicon substrate is of the second conductivity type, for example, is weakly-conducting, having a carrier concentration of approximately $5 \cdot 10^{14}$ cm$^{-3}$. In this semiconductor substrate is arranged a strongly doped source zone 2 of the first conductivity type, and a likewise strongly doped drain zone 3 of the first conductivity type, which for example are strongly n-doped with phosphorous, having a carrier concentration of more than approximately $10^{19}$ cm$^{-3}$. Between the source zone 2 and the drain zone 3 extends the channel zone 5 which runs at a distance of approximately 100 to 1000 nm beneath the substrate surface 10. This channel zone 5 likewise has the first conductivity type; it being n-doped with phosphorus, for example, having a carrier concentration of approximately $10^{16} - 5 \cdot 10^{16}$ cm$^{-3}$.

In the vicinity of the source zone 2, in the semiconductor substrate beneath the channel zone 5 there is arranged a further doped zone 4 which bears the second conductivity type, is p-doped for example, and has a carrier concentration of $1 - 10 \cdot 10^{16}$ cm$^{-3}$. A doped zone of this type arranged beneath the channel zone in the semiconductor substrate can be produced with the aid of ion implantation employing an implantation mask, as implantation doping allows the concentration maximum to lie not on the substrate surface but in deeper regions of the substrate. The source-zone 2 and the drain zone 3 are provided with electrical terminals, for example, with vapor-deposited aluminum conductor paths 8 and 9. Above the channel zone 5 is arranged the gate insulating layer 6, e.g., a SiO$_2$ layer. This gate-insulating layer 6 consists of individual sub-zones 60, 61, 62, 63 which differ in thickness. The gate electrode layer 7 is arranged on this gate-insulating layer 6. In accordance with a preferred embodiment of the invention, this gate electrode layer 7 is arranged in such a manner that it is offset relative to the drain zone 3 by a distance 1, which distance 1 amounts to approximately 100–1000 nm. FIG. 3 also indicates those individual parts of the MIS field effect transistor in accordance with the invention which correspond to the individual elements of the chain circuit shown in FIG. 1. The transistor $T_0$ corresponds to that part of the field effect transistor which comprises the source electrode, the further doped zone 4, the part 60 of the insulating layer 6, and the overlying part of the gate electrode 7. The source electrode of the next transistor $T_1$ is formed by that part of the channel zone 5 which lies beneath the zone 60 of the insulating layer 6. That part of the channel zone 5 which lies beneath the zone 61 of the insulating layer can simultaneously be considered as the drain-zone of the transistor $T_0$; at the same time it constitutes the channel zone of the transistor $T_1$ and the source-zone of the next transistor $T_2$. The structure of a field effect transistor as illustrated in FIG. 3 can be considered overall as a circuit composed of an enhancement field effect transistor $T_0$ and three further field effect transistors $T_1$, $T_2$ and $T_3$.

Figure 4:
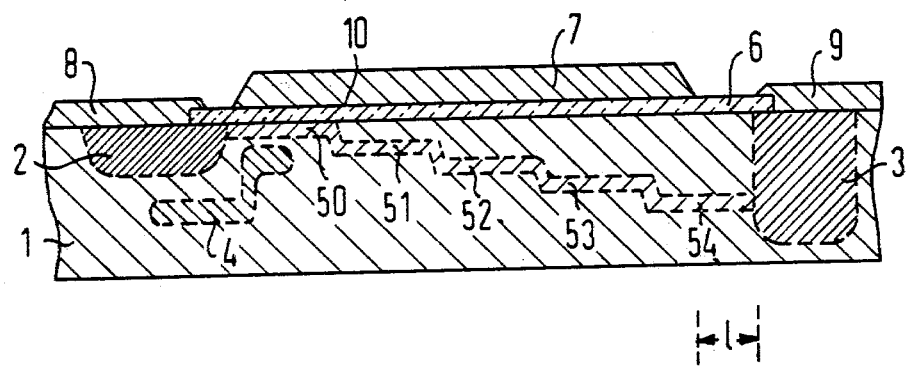

FIG. 4 illustrates a further exemplary embodiment of a MIS field effect transistor in accordance with the invention. This differs from the embodiment shown in FIG. 3 in that the gate-insulating layer 6 has a uniform thickness and the increase in distance between the gate electrode 7 and the channel zone 5 is produced in that the channel zone 5 is arranged in increasingly deeper regions of the semiconductor substrate 1 leading from the substrate surface 10 towards the drain zone 3. Thus, the channel zone 5 consists of individual zones 50, 51, 52, 53 and 54 which are offset from one another in stepped fashion.

Figure 5:
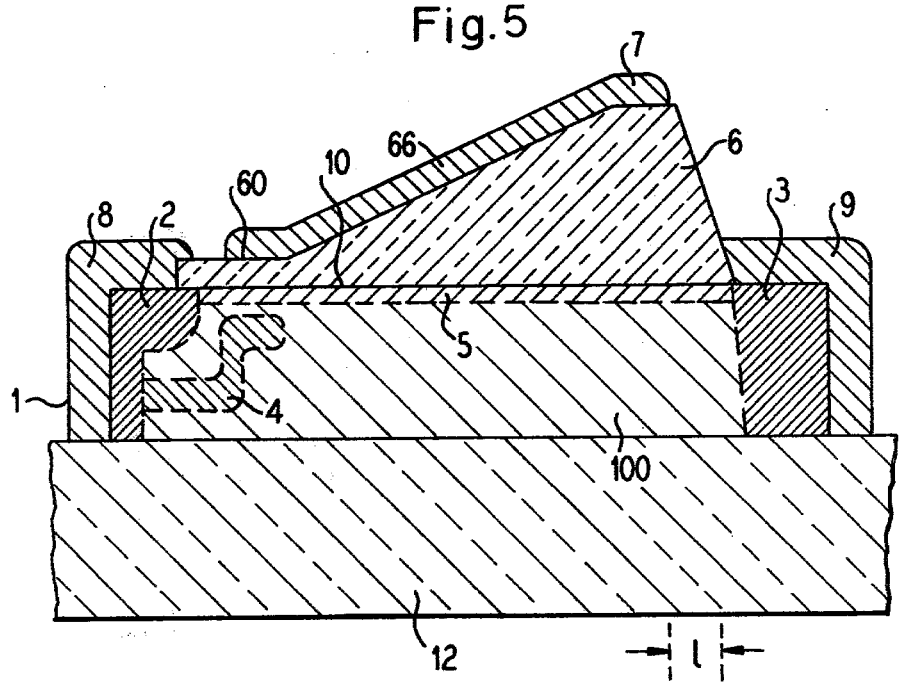

FIG. 5 illustrates a further exemplary embodiment of the invention which can be produced by the technique of epitaxial silicon films on an insulating substrate. This MIS field effect transistor consists of an insulating substrate 12, for example, a sapphire substrate, on which an epitaxial silicon film is deposited and from which individual Si-islands 100 have been etched. These epitaxial silicon islands 100 are, for example, weakly p-doped with a dopant concentration of $5 \cdot 10^{14}$ cm$^{-3}$. In accordance with the examplary embodiments described in the aforegoing, a strongly n-doped source zone 2 and a likewise strongly n-doped drain zone 3 are arranged in an epitaxial silicon island 100 of this type. The channel zone 5 extends beneath the substrate surface 10 between the source-zone 2 and the drain-zone 3. The gate-insulating layer 6 possesses a component 60 which has a uniform thickness and which is arranged above the further doped zone 4 contained in the epitaxial silicon island, and a component 66 which rises in wedge-shape and in which the thickness of the gate-insulating layer increases from approximately 60 nm to 6000 nm. The gate electrode 7, for example an aluminum layer, is deposited on the gate-insulating layer 6. The source-zone 2 and the drain-zone 3 are provided with electric supply lines 8 and 9.

In FIGS. 1 and 2:

$S_i$ is the source of the transistor $T_i$ $D_i$ is the drain of the transistor $T_i$ $U_{DB}$ is the drain breakdown voltage of the transistor $T_i$.

$U_{Di}$ is the drain voltage.

$J_i$ is the drain current.

$U_{Satti}$ is the saturation voltage.

$U_G$ is the gate voltage.

It will be apparent to those skilled in the art that many modifications and variations may be effected without departing from the spirit and scope of the novel concepts of the present invention.

I claim as my invention:

1. MIS field effect transistor for high drain voltages comprising a semiconductor substrate of the second conductivity type, a source zone of the first conductivity type in the semiconductor substrate adjacent one surface thereof, a drain zone of the first conductivity type in said substrate adjacent said one surface, a channel zone of the first conductivity type lying between said source and drain zones, an insulating layer on said one surface over said channel zone, a gate electrode on said insulating layer, said substrate having a buried zone of the same conductivity type as said substrate but more heavily doped, said buried zone being spaced below said one surface which lies close beside said source zone and beneath said channel zone, the distance between said gate electrode and said channel zone increases in the direction towards the drain zone.

2. MIS field effect transistor for high drain voltages as claimed in claim 1, in which the spacing between said buried doped zone and said source zone is within a distance of 1000 nm.

3. MIS field effect transistor as claimed in claim 1, in which the distance between said gate electrode and said channel zone increases in stepped fashion.

4. MIS field effect transistor as claimed in claim 2, in which the distance between said gate electrode and said channel zone increases in stepped fashion.

5. MIS field effect transistor as claimed in claim 1, in which the distance between said gate electrode and said channel zone increases continuously.

6. MIS field effect transistor as claimed in claim 2, in which the distance between said gate electrode and said channel zone increases continuously.

7. MIS field effect transistor for high drain voltages comprising a semiconductor substrate of the second conductivity type, a source zone of the first conductivity type in the semiconductor substrate adjacent one surface thereof, a drain zone of the first conductivity type in said substrate adjacent said one surface, a channel zone of the first conductivity type lying between said source and drain zones, an insulating layer on said one surface over said channel zone, a gate electrode on said insulating layer, said substrate having a buried zone of the same conductivity type as said substrate but more heavily doped, said buried zone being spaced below said one surface which lies close beside said source zone and beneath said channel zone, the distance between said gate electrode and said channel zone increases in the direction toward the drain zone, in which in the vicinity of the source zone, said channel zone adjoins the surface of said semiconductor substrate, and wherein the distance of said channel zone from the substrate surface increases in the direction towards said drain zone.

8. MIS field effect transistor for high drain voltages comprising a semiconductor substrate of the second conductivity type, a source zone of the first conductivity type in the semiconductor substrate adjacent one surface thereof, a drain zone of the first conductivity type in said substrate adjacent said one surface, a channel zone of the first conductivity type lying between said source and drain zones, an insulating layer on said one surface over said channel zone, a gate electrode on said insulating layer, said substrate having a buried zone of the same conductivity type as said substrate but more heavily doped, said buried zone being spaced below said one surface which lies close beside said source zone and beneath said channel zone, the distance between said gate electrode and said channel zone increases in the direction toward the drain zone, in which in the vicinity of the source zone, said channel zone adjoins the surface of said semiconductor substrate, and the distance of said channel zone from the substrate surface increases in the direction towards said drain zone, the spacing between said buried dope zones and said source zone being within a distance of 1000 mm.

9. MIS field effect transistor as claimed in claim 1, in which the thickness of said insulating layer increases from said source zone in the direction of said drain zone.

10. MIS field effect transistor as claimed in claim 9, in which the thickness of said insulating layer above said further doped zone of said second conductivity type is uniform, and increases in wedge-shape in the direction towards said drain zone.

11. MIS field effect transistor as claimed in claim 1, in which said further doped zone contains implanted dopant particles.

12. MIS field effect transistor as claimed in claim 1, in which said channel zone is implanted with dopant particles.

13. MIS field effect transistor as claimed in claim 1, in which said semiconductor substrate consists of silicon.

14. MIS field effect transistor as claimed in claim 1, in which said semiconductor substrate is p-conducting having a carrier concentration of approximately $5 \cdot 10^{14}$ cm$^{-3}$.

15. MIS field effect transistor as claimed in claim 2, in which said channel zone is doped to be n-conducting, having a carrier concentration of between approximately $1 \cdot 10^{16}$ and $5 \cdot 10^{16}$ cm$^{-3}$.

16. MIS field effect transistor as claimed in claim 1, in which said further doped zone is p-conducting, having a carrier concentration of between approximately $1 \cdot 10^{16}$ and $5 \cdot 10^{16}$ cm$^{-3}$.

17. MIS field effect transistor as claimed in claim 2, in which the distance of said gate electrode from said channel zone above said further doped zone amounts to approximately 60 nm, from where it increases to approximately 6000 nm in the direction towards said drain zone.

18. MIS field effect transistor as claimed in claim 1, in which said gate electrode is offset relative to said drain zone by a distance having a length of between 100 and 10,000 nm.

19. MIS field effect transistor comprising an integrated enhancement type field effect transistor serially connected to a plurality of depletion type field effect transistors formed in a single substrate, said substrate being of the second conductivity type, a source zone of the first conductivity type in the semiconductor substrate adjacent one surface thereof, a drain zone of the first conductivity type in said substrate adjacent said one surface, a channel zone of the first conductivity type lying between said source and drain zones, an insulating layer on said one surface over said channel zone, a gate electrode on said insulating layer, said substrate having a buried zone of the same conductivity type as said substrate but more heavily doped, said buried zone being spaced below said one surface which lies close beside said source zone and beneath said channel zone, the distance between said gate electrode and said channel zone progressively increasing in the direction towards said drain zone.

* * * * *